United States Patent
Katayama et al.

[11] Patent Number: 5,696,034
[45] Date of Patent: Dec. 9, 1997

[54] METHOD FOR PRODUCING SEMICONDUCTOR SUBSTRATE

[75] Inventors: Masatake Katayama; Isao Moroga; Isao Shirai, all of Gunma-ken; Youichi Kumaki; Akio Kasahara, both of Nigata-ken, all of Japan

[73] Assignee: Shin-Etsu Handotai Co., Ltd.

[21] Appl. No.: 520,189

[22] Filed: Aug. 28, 1995

[30] Foreign Application Priority Data

Aug. 31, 1994  [JP]  Japan .................... 6-230476

[51] Int. Cl.$^6$ .................... H01L 21/465
[52] U.S. Cl. .................... 437/228; 437/86; 437/226; 437/234; 437/974; 156/625.1; 156/653.1; 148/DIG. 135
[58] Field of Search .................... 437/6, 225, 226, 437/228, 233, 234, 235, 86, 974; 156/625.1, 653.1, 654.1, 655.1, 636.1; 148/DIG. 135

[56] References Cited

U.S. PATENT DOCUMENTS

| | | | |
|---|---|---|---|
| 3,462,322 | 8/1969 | Hennings et al. | 148/DIG. 135 |
| 5,426,073 | 6/1995 | Imaoka et al. | 437/228 POL |

FOREIGN PATENT DOCUMENTS

| | | | |
|---|---|---|---|
| 0092673 | 8/1978 | Japan | 437/6 |
| 0094778 | 8/1978 | Japan | 437/6 |
| 0157254 | 8/1985 | Japan | 437/6 |
| 0171722 | 9/1985 | Japan | 437/6 |
| 02 001985 | 1/1990 | Japan . | |
| 4-286163 | 10/1992 | Japan . | |
| 06 151864 | 5/1994 | Japan . | |

*Primary Examiner*—John Niebling
*Assistant Examiner*—Long Pham
*Attorney, Agent, or Firm*—Barnes & Thornburg

[57] ABSTRACT

A method for producing a semiconductor substrate in which no autodoping occurs and slip dislocations in the substrate are reduced. The method involves forming a silicon nitride film on the backside of an $n^-$-silicon substrate, epitaxially growing an $n^+$-buffer layer and a $p^+$-layer on the front side of the $n^-$-silicon substrate, and decreasing the thickness of the $n^-$-silicon substrate from the backside.

12 Claims, 5 Drawing Sheets

METHOD FOR PRODUCING SEMICONDUCTOR SUBSTRATE

BACKGROUND OF THE INVENTION

1. Field of the Invention

The present invention relates to a method for producing a semiconductor substrate. More particularly, the present invention relates to the method for producing a semiconductor substrate suitable for IGBT (an abbreviation for 'Insulated Gate Bipolar Transistor') used in an inverter, a small power converter or the like.

2. Related Prior Art

IGBTs are used in, for example, an inverter or a small power converter as a power semiconductor element with capabilities both of high speed switching, characteristic of the power MOSFET and of high power handling, characteristic of the bipolar transistor.

The substrate for fabricating an IGBT has a structure in which, on a $p^+$-silicon substrate 40 of a high concentration (a low resistivity) of boron (B), a phosphorus (P) doped $n^+$-silicon buffer layer 41 (hereinafter referred to as '$n^+$buffer layer') and a $n^-$-silicon layer 42 of a low concentration (a high resistivity) of phosphorous (hereinafter referred to as '$n^-$ layer') are grown in the sequence of the written order, for example as shown in FIG. 4.

FIGS. 5(a) to 5(e) illustrate an example of a prior art process for producing a substrate for IGBT.

The process has the following steps of:

using a boron doped $p^+$-silicon substrate 40 (FIG. 5(a));

protecting the backside surface of the substrate 40 by forming a silicon oxide film 43 in CVD on the backside surface (FIG. 5(b));

growing epitaxially a phosphorous doped $n^+$ buffer layer 41 (FIG. 5(c)); and a phosphorous doped $n^-$ layer 42 (FIG. 5(d)) on the frontside surface;

processing and/or polishing the backside of the $p^+$-silicon substrate 40 to decrease the thickness to a predetermined one and thereby to expose a thickness-decreased and/or polished surface corresponding to a dash line D—D (FIG. 5(e)), and, as a result, the substrate for IGBT is obtained.

It is to prevent boron autodoping from the backside surface of the $p^+$-silicon substrate 40 that the silicon oxide film 43 is formed on the backside surface of the substrate 40.

In other words, in case wherein the backside surface of the $p^+$-silicon substrate 40 is not protected by the silicon oxide film 43, boron is vaporized from the backside surface of the substrate 40 which is highly doped by boron during epitaxial growth, the boron has chances to get into the $n^+$ buffer layer 41 and the $n^-$ layer 42, which are relatively lower in dopant concentration and have the other conductivity, that is, so-called vapor-phase autodoping occurs, precise resistivity control of the $n^+$ buffer layer 41 and the $n^-$ layer 42 becomes impossible, and thus semiconductor devices with good electrical characteristics are hard to be produced.

In order to prevent such autodoping, the backside surface of the $p^+$-silicon substrate 40 is protected by the silicon oxide film 43 so that boron, which is a p-type dopant, may not be vaporized.

In the method above mentioned, however, a phenomenon has not been able to be prevented that, at the beginning of epitaxial growth, boron also vaporizes from the frontside surface of the $p^+$-silicon substrate 40 and it then gets into the $n^+$-buffer layer 41 and $n^-$-layer 42, though the vaporization of boron from the backside surface can be prevented.

In consideration of such conditions, a new method has been proposed in an unexamined publication of Japanese Patent Application No. J P A 4-286163.

This is a method to obtain a substrate for IGBT comprising, as shown in FIGS. 6(a) to 6(d), the following steps of:

growing epitaxially a phosphorous doped $n^+$-buffer layer 51 (FIG. 6(b));

and a $p^+$-layer 52 with a high concentration of boron (FIG. 6(c)) on one of the main surfaces of an $n^-$-silicon substrate 50 of a low concentration of phosphorous (FIG. 6(a)) in the sequence of the written order; and thereafter, grinding and/or polishing the backside surface of an $n^+$-silicon substrate 50 up to a predetermined thickness to expose a ground and/or polished surface corresponding a dash line E—E.

According to this method, no autodoping influence is observed, since the $n^-$-silicon substrate 50 is lower in dopant concentration compared to the epitaxially grown $p^+$-layer 52.

The method above mentioned draws attention as an epoch-making method, but has a new problem that, when a $p^+$-layer is epitaxially grown, slip dislocations of a high density occurs in the $n^-$-silicon substrate.

SUMMARY OF THE INVENTION

It is an object of the present invention to provide an improved method for producing a substrate for IGBT wherein it is possible that no autodoping occurs and slip dislocations in the substrate are reduced.

A first aspect of the present invention is directed to a method for producing a semiconductor which comprises the following steps of:

forming a silicon nitride film on a first main surface of an n-type single crystal silicon substrate of a high resistivity by chemical vapor deposition;

growing an n-type first silicon layer of a lower resistivity than the silicon substrate on a second main surface, which is the opposite of the first main surface, of the silicon substrate;

growing a p-type second silicon layer of a lower resistivity than the first silicon layer on the first silicon layer; and processing and/or polishing the first main surface of the substrate, on which the aforementioned silicon nitride film is formed, to decrease the thickness to a predetermined one.

A second aspect of the present invention is directed to a method for producing a semiconductor substrate which comprises the following steps of:

growing a first silicon layer of a first conductivity type and of a lower resistivity than a single crystal silicon substrate, which is of the first conductivity type, of 800 µm or more in thickness and of a high resistivity, on a first main surface of the silicon substrate;

growing a second silicon layer of a second conductivity type and of a lower resistivity than the first silicon layer on the first silicon layer; and processing and/or polishing a second main surface, which is the opposite of the first main surface, of the silicon substrate to decrease the thickness to a predetermined one.

A third aspect of the present invention is directed to a method for producing a semiconductor substrate which comprises the following steps of:

growing a first silicon layer of a first conductivity type and of a lower resistivity than a single crystal silicon substrate, which is of the first conductivity type and of a high resistivity on a first main surface of the silicon substrate;

growing a second silicon layer of a second conductivity type and of a lower resistivity than the first silicon layer on the first silicon layer;

growing a third silicon layer of a higher resistivity than the second silicon layer on the second silicon layer; and processing and/or polishing a second main surface, which is the opposite of the first main surface, of the silicon substrate to decrease the thickness to a predetermined one.

In the aforementioned methods, it is preferred that:

the resistivity of the single crystal silicon substrate is 30 Ω.cm or more;

the resistivity of the first silicon layer is in the range of 0.05 Ω.cm to 0.5 Ω.cm;

the resistivity of the second silicon layer is 0.1 Ω.cm or less; and the resistivity of the third silicon layer is 10 times or more as high as that of the second silicon layer.

As for methods for processing to decrease the thickness, there are grinding, lapping, etching, combinations of them and the like. Any of them will do.

Slip dislocations occurring at a high density in a silicon substrate of a low dopant concentration, in other words of a high resistivity, are greatly influenced by bow of the silicon substrate during the epitaxial growth of a second silicon layer of the opposite conductivity type and of a high dopant concentration, in other words of a low resistivity.

For example, in accompanying with the epitaxial growth of a $p^+$-second silicon layer, the second silicon layer generally shrinks and thus an $n^-$-silicon substrate warps so that the side of the second silicon layer is concave. The bow of the substrate increases with increase in the thickness of the second silicon layer.

It is thought that, when the internal stress grows beyond a limit by increase in the bow, slip dislocations will occur.

Consequently, if the bow of the second silicon layer in epitaxial growth is decreased, the density of-slip dislocations can be reduced.

In the first aspect of the present invention, since a silicon nitride film is formed on a main surface of an n-type single crystal silicon substrate of a high resistivity by chemical vapor deposition, a stress works such that the silicon nitride side of the substrate becomes concave so as to compensate another stress occurring on a second silicon layer side, whereby the bow of the substrate is suppressed.

In the second aspect of the present invention, since the thickness of a single crystal silicon substrate is set at 800 μm or more, which range is larger than a generally used range of 400 μm to 750 μm, the strength of the substrate itself against the bow becomes larger by the extent corresponding to increase in the thickness of the substrate, whereby the bow of the substrate is suppressed.

In the third aspect of the present invention, since a third silicon layer of a lower dopant concentration, or a higher resistivity, than those of a second silicon layer, which is of a high dopant concentration, or a low resistivity, is grown on the second silicon layer as the uppermost layer of a low dopant concentration that relatively does not cause bow, the bow of the substrate is reduced more compared to the case where the second silicon layer of a high dopant concentration is located as the uppermost layer.

BRIEF DESCRIPTION OF THE DRAWINGS

Many other features, advantages and additional objects of the present invention will become manifest to those versed in the art upon making reference to the detailed description which follows and the accompanying sheet of drawings.

DETAILED DESCRIPTION OF THE INVENTION

In the following description, examples of the present invention will be explained in reference to the accompanying drawings

Example 1

FIGS. 1(a) to 1(e) are illustrating a flow chart of an example of a first embodiment of the present invention.

Figure 1A:
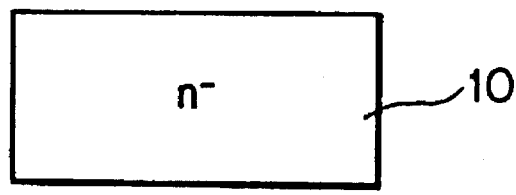
FIGS. 1(a) to 1(e) are a flow chart illustrating an example of an embodiment of the present invention.

As for a substrate wafer, a phosphorous doped $n^-$-silicon substrate 10, which was grown by a FZ method and had a surface orientation of (100), a resistivity of 80 Ω.cm, a diameter of 125 mm and an initial thickness of 550 μm, was used (FIG. 1(a)).

Figure 1B:
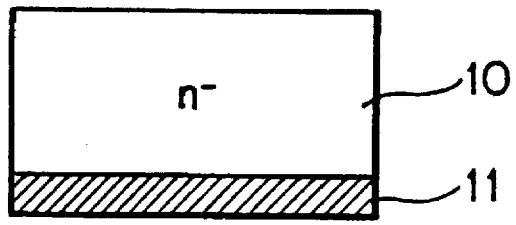

A silicon nitride film 11 of 100 nm thick was formed on the backside surface of the silicon substrate 10 by CVD (FIG. 1(b)).

Figure 1C:
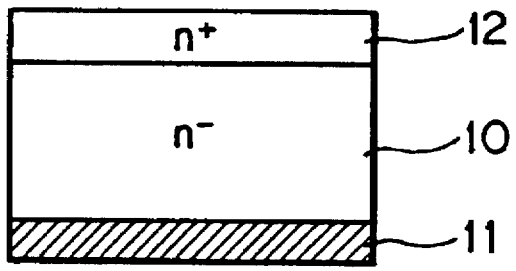
Figure 1D:
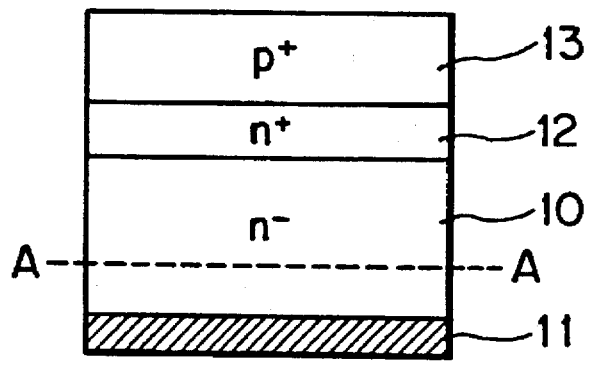
Figure 1E:
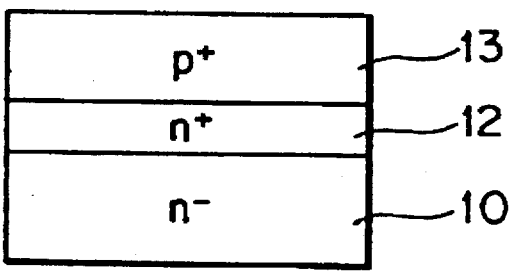

Then, on the frontside surface of the substrate 10, a phosphorous doped $n^+$-buffer layer 12 of a resistivity of 0.1 Ω.cm and of 10 μm thick (FIG. 1(c)) and a boron doped $p^+$-layer 13 of a resistivity of 0.015 Ω.cm and of 300 μm thick respectively were epitaxially grown (FIG. 1(d)); and in the last step, the backside surface of the $n^-$-silicon substrate was ground and polished to thereby expose a ground and/or polished surface corresponding to a dash line A—A, so that a substrate for IGBT of the total thickness of about 500 μm thick was obtained (FIG. 1(e)).

The bow and slippage density of the substrate for IGBT produced by the aforementioned method were measured.

This substrate had bow on the order of 20 μm, though the bow being concave on the $p^+$-layer side, and the slip dislocation density in the $n^-$-silicon substrate was $2\times10^3$ dislocations/cm².

Example 2

FIGS. 2(a) to 2(d) are a flow chart illustrating an example of a second embodiment of the present invention.

Figure 2A:
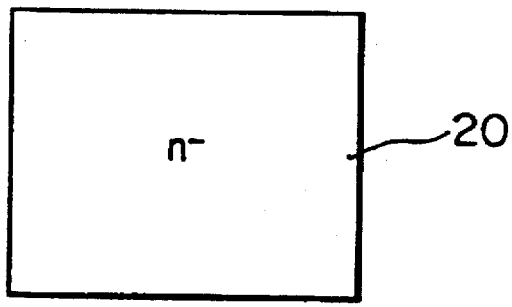
FIGS. 2(a) to 2(d) are a flow chart illustrating an example of a second embodiment of the present invention.

As for substrate wafers, phosphorous doped n⁻-silicon substrates 20, both of which were grown by a FZ method and had a surface orientation of (100), a resistivity of 80 Ω.cm, a diameter of 125 mm, but the initial thicknesses of which were respectively 1000 μm and 1500 μm, were used (FIG. 2(a)).

Figure 2B:
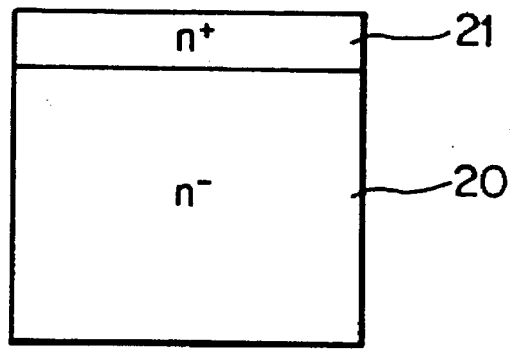
Figure 2C:
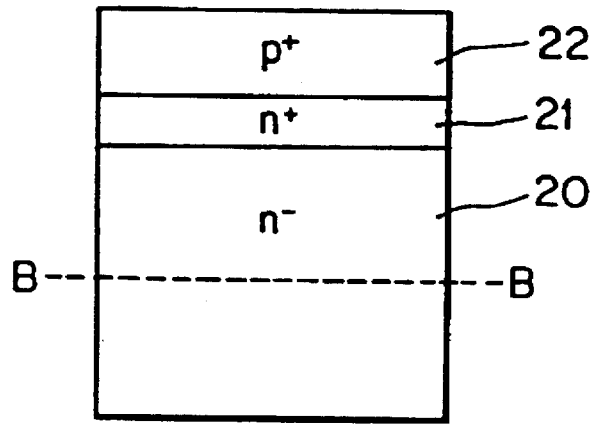
Figure 2D:
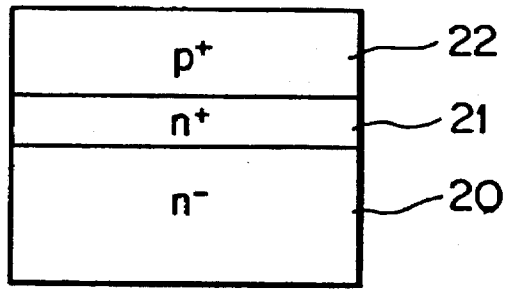

On the frontside surface of each substrate 20, a phosphorous doped n⁺-buffer layer 21 of a resistivity of 0.1 Ω.cm and of 10 μm thick (FIG. 2(b)) and a boron doped p⁺-layer 22 of a resistivity of 0.015 Ω.cm and of 300 μm thick respectively were epitaxially grown (FIG. 2(c)); and In the last step, the backside surfaces of the n⁻-silicon substrates 20 were ground and polished to thereby expose ground and polished surfaces corresponding to a dash line B—B, so that substrates for IGBT of the total thickness of about 500 μm thick were obtained (FIG. 2(d)).

The bow and slippage density of each of the substrates for IGBT produced by the aforementioned method were measured.

These substrates both had bows on the order of 30 μm, though the bows each being concave on the p⁺-layer side, and the slip dislocation densities in the n⁻-silicon substrates were respectively 4×10² dislocations/cm² for the thickness of 1000 μm and 5×10² dislocations/cm² for the thickness of 1500 μm.

Example 3

FIGS. 3(a) to 3(e) are a flow chart illustrating an example of a third embodiment of the present invention.

Figure 3A:
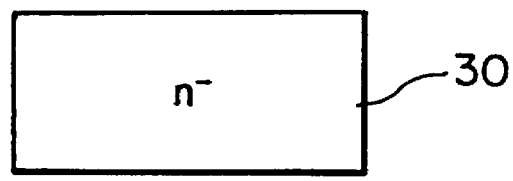
FIGS. 3(a) to 3(e) are a flow chart illustrating an example of a third embodiment of the present invention.

As for substrate wafers, a phosphorous doped n⁻-silicon substrate 30, which was grown by a FZ method and had a surface orientation of (100), a resistivity of 80 Ω.cm, a diameter of 125 mm, and an initial thickness of 550 μm (FIG. 3(a)), was used.

Figure 3B:
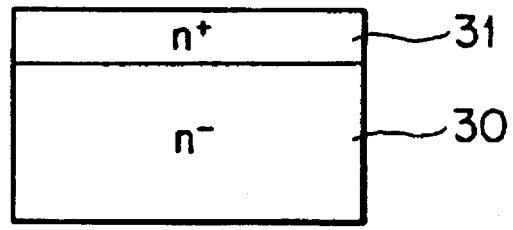
Figure 3C:
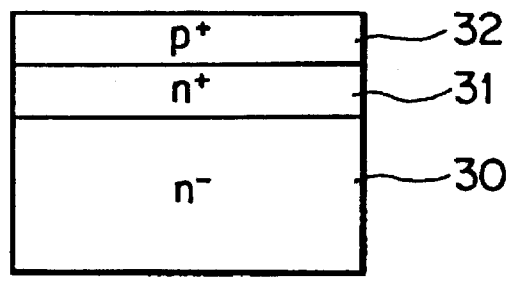
Figure 3D:
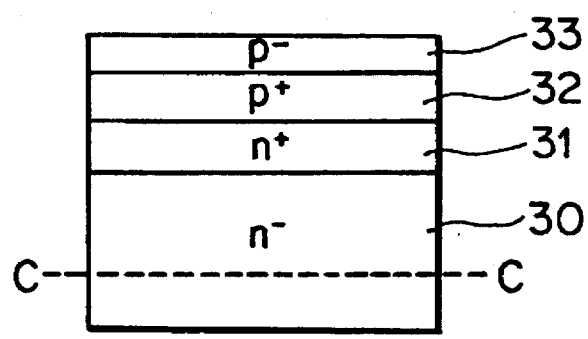
Figure 3E:
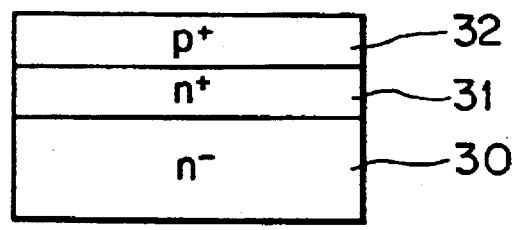
Figure 4:
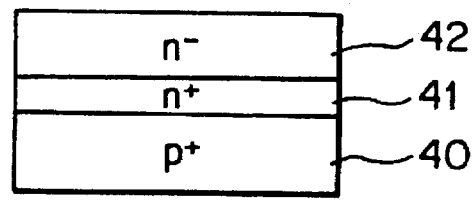
FIG. 4 is a sectional view illustrating an example of a substrate for IGBT.
Figure 5A:
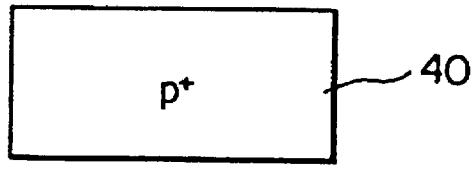
FIGS. 5(a) to 5(e) are a flow chart illustrating an example of a conventional method for producing a substrate for IGBT.
Figure 5B:
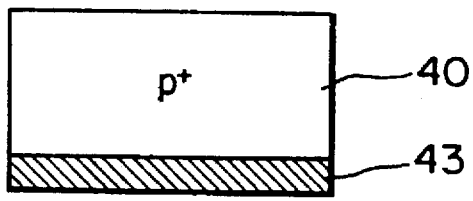
Figure 5C:
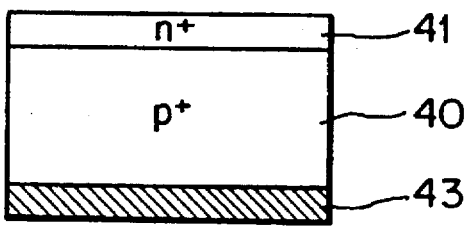
Figure 5D:
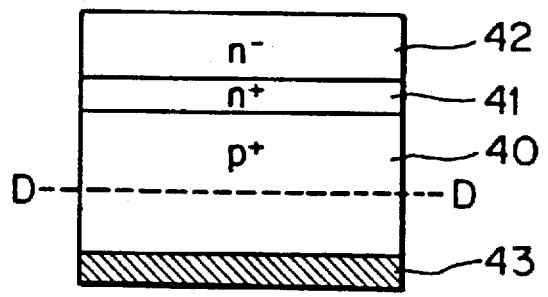
Figure 5E:
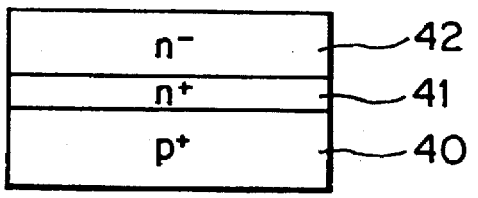
Figure 6A:
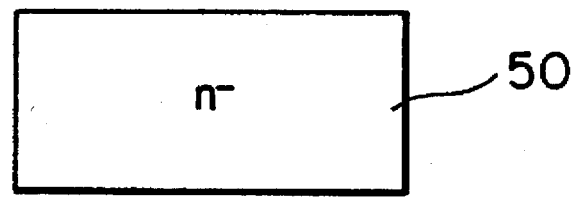
FIGS. 6(a) to 6(d) are a flow chart illustrating an example of another conventional method for producing a substrate for IGBT.
Figure 6B:
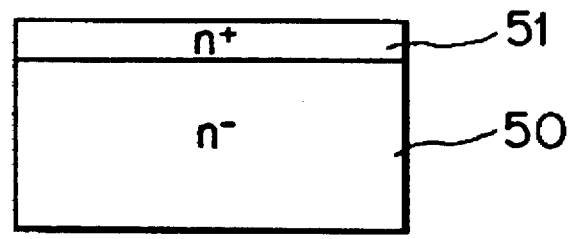
Figure 6C:
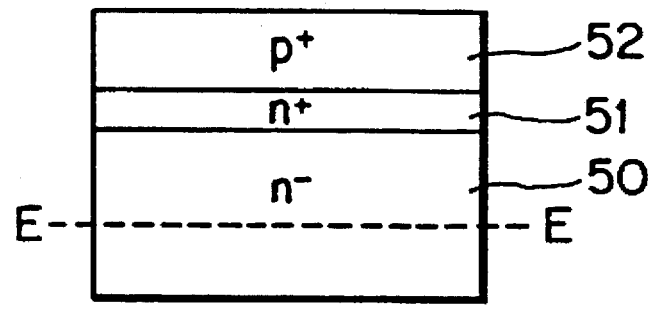
Figure 6D:
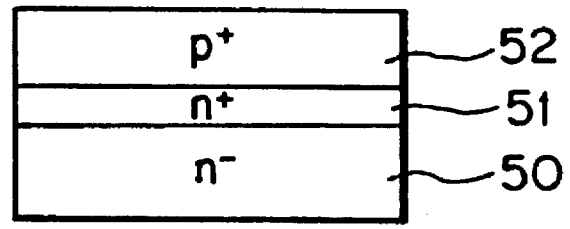

A phosphorous doped n⁺-buffer layer 31 of a resistivity of 0.1 Ω.cm and of 10 μm thick was epitaxially grown (FIG. 3(b));

then, a boron doped p⁺-layer 32 of a resistivity of 0.015 Ω.cm and of 200 μm thick (FIG. 3(c)) and an undoped silicon layer 33 of a resistivity larger than 0.15 Ω.cm and of 100 μm thick respectively were epitaxially grown in the sequence of the written order (FIG. 3(d)); and in the last step, the backside surface of the n⁻-silicon substrate 30 was ground and polished to expose a ground and polished surface corresponding to a dash line C—C, while the undoped silicon layer 33 was also processed to be removed, so that a substrate for IGBT of the total thickness of about 500 μm thick, where the thickness of the n⁻-silicon substrate 30 was about 300 μm, was obtained (FIG. 3(e)).

The bow and slippage density of the substrate for IGBT produced by the aforementioned method was measured.

This substrate had bow on the order of 25 μm, though the bow being a concave on the p⁺-layer side, and the slip dislocation density in the n⁻-silicon substrate was 1×10³ dislocations /cm².

Comparative Example 1

A substrate for IGBT was produced under the same conditions as in EXAMPLE 1, except that a silicon nitride film was not formed on the backside surface of a substrate.

In this substrate for IGBT, bow as large as 75 μm, which was concave on the p⁺-layer side and the slip dislocation density in the n⁻-silicon substrate was 1×10⁴ dislocations/cm².

Although, in the aforementioned EXAMPLES 1 to 3 and COMPARATIVE EXAMPLE 1, n⁺-buffer layers 12, 21 and 31 were grown by an epitaxial growth method, but even when n⁺-buffer layers were formed by a diffusion method or ion implantation method instead of an epitaxial growth method, results similar to the aforementioned were obtained.

As is clear from the above description, according to the methods for producing a semiconductor substrate of the present invention, it is possible that the impurity concentration of each layer is precisely controlled and thereby the resistivity is also stabilised, since occurrence of autodoping can be prevented.

Especially, as for a substrate for IGBT, production of a semiconductor substrate more suitable for IGBT becomes a real possibility, since fabrication of an IGBT having a high withstand voltage becomes easy due to the use of the silicon substrate of a high resistivity and besides the density of slip dislocations in the substrate can be reduced.

We claim:

1. A method for producing a semiconductor substrate comprising the following steps of:

forming a silicon nitride film on a first main surface of an n-type single crystal silicon substrate of a high resistivity by chemical vapor deposition;

growing an n-type first silicon layer of a lower resistivity than the silicon substrate on a second main surface, which is the opposite of the first main surface, of the silicon substrate;

growing a p-type second silicon layer of a layer of a lower resistivity than the first silicon layer on the first silicon layer; and removing a portion of the first main surface of the n-type single crystal silicon substrate on which the silicon nitride is formed to reduce a thickness thereof.

2. A method for producing a semiconductor substrate comprising the following steps of:

growing a first silicon layer of a first conductivity type and of a lower resistivity than a single crystal silicon substrate, which is of the first conductivity type, of 800 μm or more in thickness and of a high resistivity, on a first main surface of the silicon substrate;

growing a second silicon layer, of a second conductivity type and of a lower resistivity than the first silicon layer, on the first silicon layer; and removing a portion of a second main surface of the silicon substrate to reduce a thickness thereof.

3. A method for producing a semiconductor substrate claimed in claim 1, wherein:

the resistivity of the single crystal silicon substrate is 30 Ω.cm or more;

the resistivity of the first silicon layer is in the range of 0.05 Ω.cm to 0.5 Ω.cm; and the resistivity of the second silicon layer is 0.1 Ω.cm or less.

4. A method for producing a semiconductor substrate claimed in claim 2, wherein:

the resistivity of the single crystal silicon substrate is 30 Ω.cm or more;

the resistivity of the first silicon layer is in the range of 0.05 Ω.cm to 0.5 Ω.cm; and the resistivity of the second silicon layer is 0.1 Ω.cm or less.

5. A method for producing a semiconductor substrate comprising the following steps of:

forming a silicon nitride film on a first main surface of an n-type single crystal silicon substrate of a high resistivity by chemical vapor deposition;

growing an n-type first silicon layer of a lower resistivity than the silicon substrate on a second main surface, which is the opposite of the first main surface, of the silicon substrate; and growing a p-type second silicon layer of a layer of a lower resistivity than the first silicon layer on the first silicon layer.

6. A method for producing a semiconductor substrate comprising the following steps of:

growing a first silicon layer of a first conductivity type and of a lower resistivity than a single crystal silicon substrate, which is of the first conductivity type, of 800 µm or more in thickness and of a high resistivity, on a first main surface of the silicon substrate; and growing a second silicon layer, of a second conductivity type and of a lower resistivity than the first silicon layer, on the first silicon layer.

7. A method for producing a semiconductor substrate claimed in claim 5, wherein:

the resistivity of the single crystal silicon substrate is 30 Ω.cm or more;

the resistivity of the first silicon layer is in the range of 0.05 Ω.cm to 0.5 Ω.cm; and the resistivity of the second silicon layer is 0.1 cm or less.

8. A method for producing a semiconductor substrate claimed in claim 6, wherein:

the resistivity of the single crystal silicon substrate is 30 Ω.cm or more;

the resistivity of the first silicon layer is in the range of 0.05 Ω.cm to 0.5 Ω.cm; and the resistivity of the second silicon layer is 0.1 Ω.cm or less.

9. A method for producing a semiconductor substrate comprising the following steps of:

forming a silicon nitride film on a first main surface of an n-type single crystal silicon substrate of a high resistivity by chemical vapor deposition;

growing an n-type first silicon layer of a lower resistivity than the silicon substrate on a second main surface, which is the opposite of the first main surface, of the silicon substrate;

growing a p-type second silicon layer of a layer of a lower resistivity than the first silicon layer on the first silicon layer; and processing the first main surface of the substrate on which the silicon nitride film is formed to decrease a thickness thereof, said processing being selected from the group consisting of grinding, lapping, etching, polishing, and combinations thereof.

10. A method for producing a semiconductor substrate comprising the following steps of:

growing a first silicon layer of a first conductivity type and of a lower resistivity than a single crystal silicon substrate, which is of the first conductivity type, of 800 µm or more in thickness and of a high resistivity, on a first main surface of the silicon substrate;

growing a second silicon layer, of a second conductivity type and of a lower resistivity than the first silicon layer, on the first silicon layer; and processing a second main surface of the substrate to decrease a thickness thereof, said processing being selected from the group consisting of grinding, lapping, etching, polishing, and combinations thereof.

11. A method for producing a semiconductor substrate claimed in claim 9, wherein:

the resistivity of the single crystal silicon substrate is 30 Ω.cm or more;

the resistivity of the first silicon layer is in the range of 0.05 Ω.cm to 0.5 Ω.cm; and the resistivity of the second silicon layer is 0.1 Ω.cm or less.

12. A method for producing a semiconductor substrate claimed in claim 10, wherein:

the resistivity of the single crystal silicon substrate is 30 Ω.cm or more;

the resistivity of the first silicon layer is in the range of 0.05 Ω.cm to 0.5 Ω.cm; and the resistivity of the second silicon layer is 0.1 Ω.cm or less.

\* \* \* \* \*